United States Patent [19]
Alexander

[11] 4,090,132
[45] May 16, 1978

[54] MEASUREMENT OF EXCESS CARRIER LIFETIME IN SEMICONDUCTOR DEVICES

[75] Inventor: William J. Alexander, Verona, Pa.

[73] Assignee: Solid State Measurements, Inc., Monroeville, Pa.

[21] Appl. No.: 665,571

[22] Filed: Mar. 10, 1976

[51] Int. Cl.$^2$ .......................................... G01R 31/26
[52] U.S. Cl. ............................. 324/158 D; 324/158 T
[58] Field of Search ........... 324/158 D, 158 T, 158 R, 324/73 R, 186, 187

[56] References Cited

U.S. PATENT DOCUMENTS

| | | | |
|---|---|---|---|
| 3,359,491 | 12/1967 | McCutcheon | 324/158 R |
| 3,418,573 | 12/1968 | Alford et al. | 324/73 R |

OTHER PUBLICATIONS

Lederhandler et al.; 1955; Proc. Instn. Rad. Engrs., N.Y.; 43; 477.

Howard, N.R.; 1962; J. Sci. Instrum.; 39; 647.

Primary Examiner—Rudolph V. Rolinec
Assistant Examiner—Ernest F. Karlsen
Attorney, Agent, or Firm—Thomas H. Murray

[57] ABSTRACT

A system is provided for measuring excess carrier lifetime in semiconductor devices. A series of rectangular current pulses is applied to the device to be tested, and the slope of the open-circuit voltage decay curve following termination of each pulse is observed. The slope of the curve is determined at a predetermined voltage level by means of voltage comparators which produce an output pulse having a width indicating the time interval required for the open-circuit voltage to decay from a preset level to a lower preset level. The excess carrier lifetime is determined from the slope of the voltage decay curve, and is visually displayed in microseconds in a digital display. Provision is also made for observing the voltage decay curve on an oscilloscope.

12 Claims, 3 Drawing Figures

MEASUREMENT OF EXCESS CARRIER LIFETIME IN SEMICONDUCTOR DEVICES

BACKGROUND OF THE INVENTION

The present invention relates to the measurement of the recombination lifetime of excess or injected carriers in semiconductor devices such as diodes, transistors, thyristors and similar devices, and provides a system for making such measurements and providing a direct visual digital display of the lifetime.

The recombination time, or lifetime, of excess carriers in the high resistivity regions of semiconductor devices is a parameter of great importance in the design and manufacture of such devices. Thus, in the case of high power thyristors, for example, the value of these devices in primarily dependent on a high level bulk lifetime. In such devices, excess carriers are injected into the high resistivity or base region during the ON state of the device and should have a high lifetime in order to sufficiently flood this region with carriers to keep the resistivity low, so that the voltage drop across it is as low as possible. This is necessary to keep the power dissipation as low as possible, since the ratings, and usefulness, of these devices are limited by the power dissipated in the forward conducting or ON state. Power thyristors may carry currents of hundreds, or even thousands, of amperes so that a forward drop as low as one volt may represent a power dissipation of one or more kilowatts. This results in such devices being large and heavy with massive heat sinks to prevent excessive temperature rise due to the power dissipation. It is essential, therefore, to keep the power dissipation low which requires that the resistivity and forward voltage drop be as low as possible.

Thyristors are usually turned OFF by self-commutation; that is, when the current falls below a minimum level, the internal potentials fall low enough so that the high resistivity region and its associated junction return to the equilibrium condition, and the device reverts to the high impedance or blocking state. In the absence of a forced reverse current, this can only happen when the excess carriers injected during the ON condition are reduced to near normal levels by recombination of holes and electrons in the bulk. This process takes an appreciable amount of time because of the high density of injected carriers during the ON state which may be reduced by approximately 12 or 13 orders of magnitude. The rate of which the carrier density is reduced is determined by the bulk lifetime and generally some tens of lifetimes are required to reach the OFF state.

It will be apparent, therefore, that a short carrier lifetime is required for low turn-off time, which is usually highly desirable or even essential to improve the frequency response, while a high carrier lifetime is needed to minimize the forward voltage drop and power dissipation during the ON state. These requirements of high carrier lifetime to minimize forward voltage drop and short carrier lifetime to decrease the turn-off time are obviously directly conflicting. This conflict can be resolved, however, by careful design of the device involving well balanced trade-offs to achieve satisfactory compromises for particular types of devices or for particular applications. Such design practice requires tight and effective control in the manufacture of the devices to maintain the desired values and achieve the intended design objectives at a reasonable cost.

Such control requires the use of some means for measuring the excess carrier lifetime in a reasonably rapid and accurate manner, not only for design and development purposes, but also as a continuing routine production check, or quality control test, to insure that the necessary standards are being maintained. The carrier recombination lifetime can be determined by measuring the slope of the open-circuit voltage decay curve across a semiconductor device following the termination of a current pulse, as discussed, for example, in Mazur U.S. Pat. No. 3,697,873. This has been done heretofore by displaying the voltage decay curve on an oscilloscope screen and directly measuring, or scaling-off, the slope of a predetermined portion of the curve from which the lifetime can be calculated. It is obvious that this is a cumbersome and unsatisfactory procedure for use as a routine production test, as it is difficult and time-consuming as well as being subject to operator error especially when carried out by semi-skilled production personnel.

SUMMARY OF THE INVENTION

In accordance with the present invention, there is provided a system for measuring excess carrier lifetime accurately and rapidly by electronically measuring the slope of the open-circuit voltage decay curve and determining from this the numerical value of the carrier lifetime which is shown in microseconds on a digital display.

The system includes means for repetitively applying rectangular current pulses to the device to be tested and for measuring the slope of the open-circuit voltage decay curve by observing the voltage across the device immediately following termination of each current pulse. The slope of this voltage curve at a desired voltage level is determined by means of voltage comparators which determine the time required for the voltage to decay from a first preset level to a second lower preset level. This time interval is proportional to the slope of the curve and an output pulse is produced of width corresponding to the time interval. The information contained in this pulse is converted to digital form and processed for display on a visual display which shows the lifetime directly in microseconds so that it can be read-off with little risk of operator error. A rapid and accurate system is thus provided for determining carrier lifetime which can be used in the production of semiconductor devices as well as for development purposes. To increase the usefulness of the instrument, it also provides for the use of an oscilloscope to display the current plus or voltage decay curve, as desired. The oscilloscope display is triggered at either the beginning or the termination of each current pulse, as desired, and means are provided for intensifying the oscilloscope trace in the segment of the voltage decay curve which is being measured.

BRIEF DESCRIPTION OF THE DRAWING

The invention will be more fully understood from the following detailed description, taken in connection with the accompanying drawing, in which.

DESCRIPTION OF THE PREFERRED EMBODIMENT

Figures 1, 2:
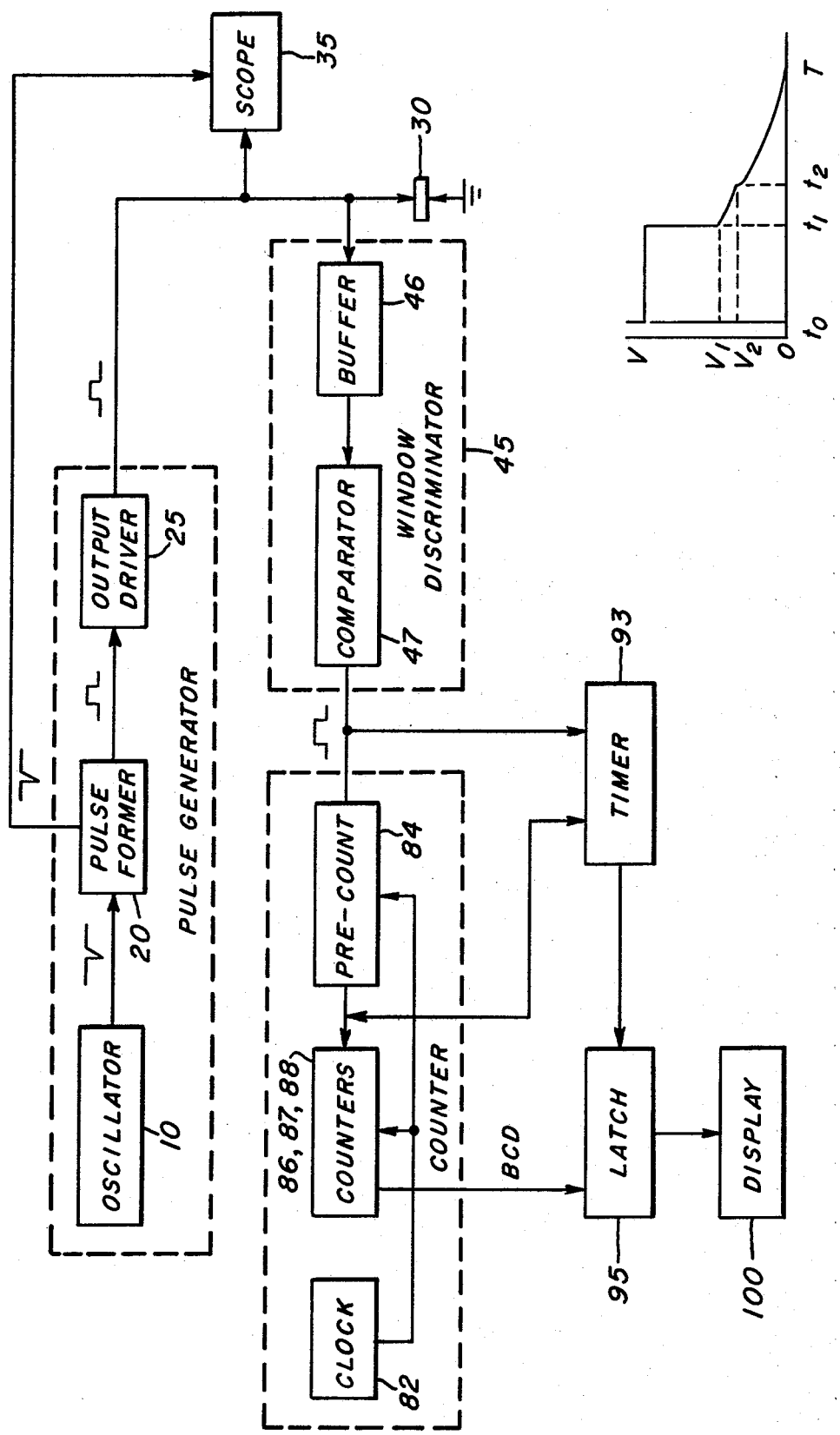
FIG. 1 shows a typical open-circuit voltage decay curve of a semiconductor device under test.
FIG. 2 is a block diagram illustrating the arrangement of the system of the invention.

As previously discussed, the excess carrier lifetime in a semiconductor device may be determined by observing the open-circuit voltage decay curve. FIG. 1 of the drawing shows the voltage across a semiconductor device, such as the base region of a power thyristor, during a single current pulse. The pulse is substantially rectangular and the voltage rises abruptly from zero to a transient spike at time $t_0$ and immediately subsides to a constant value for the duration of the pulse. It is preferred to use a current pulse which is substantially rectangular with a fall time to zero at the termination of the pulse that is as small as possible, so that the current is abruptly terminated. The shape of the voltage curve resulting from such a pulse is shown in FIG. 1, and following an abrupt drop in voltage corresponding to termination of the current the voltage decays to zero along a curve such as that shown.

The excess carrier lifetime in the semiconductor material is inversely proportional to the slope of this curve. In accordance with the invention, the slope of the curve is measured at a suitable voltage level where the curve approximates a straight line and the slope is such that an accurate determination can be made, such as the portion of the curve between the voltage levels $V_1$ and $V_2$ in FIG. 1. Such measurements have been made previously by displaying the voltage curve on an oscilloscope and scaling off the coordinates, or the positions of the points where the oscilloscope trace crosses the desired voltage levels. The slope can then be determined from these values and the carrier lifetime calculated. As pointed out above, this is a relatively difficult and time-consuming operation which is subject to operator error, and is not a desirable method for production testing. In accordance with the invention, the slope between the voltage levels $V_1$ and $V_2$ is determined by measuring the time required for the voltage to decay from level $V_1$ to level $V_2$, that is, the interval between the times $t_1$ and $t_2$ in FIG. 1. This may be done by observing the voltage following termination of each current pulse by means of voltage comparators from which an output signal or pulse can be derived representative of the time interval between $t_1$ and $t_2$. Since this is a measure of the slope of the curve, it can be used directly to determine the carrier lifetime, and the value thus obtained is displayed in microseconds, or any desired units, on a visual digital display where it can be easily read-off.

Figure 3:
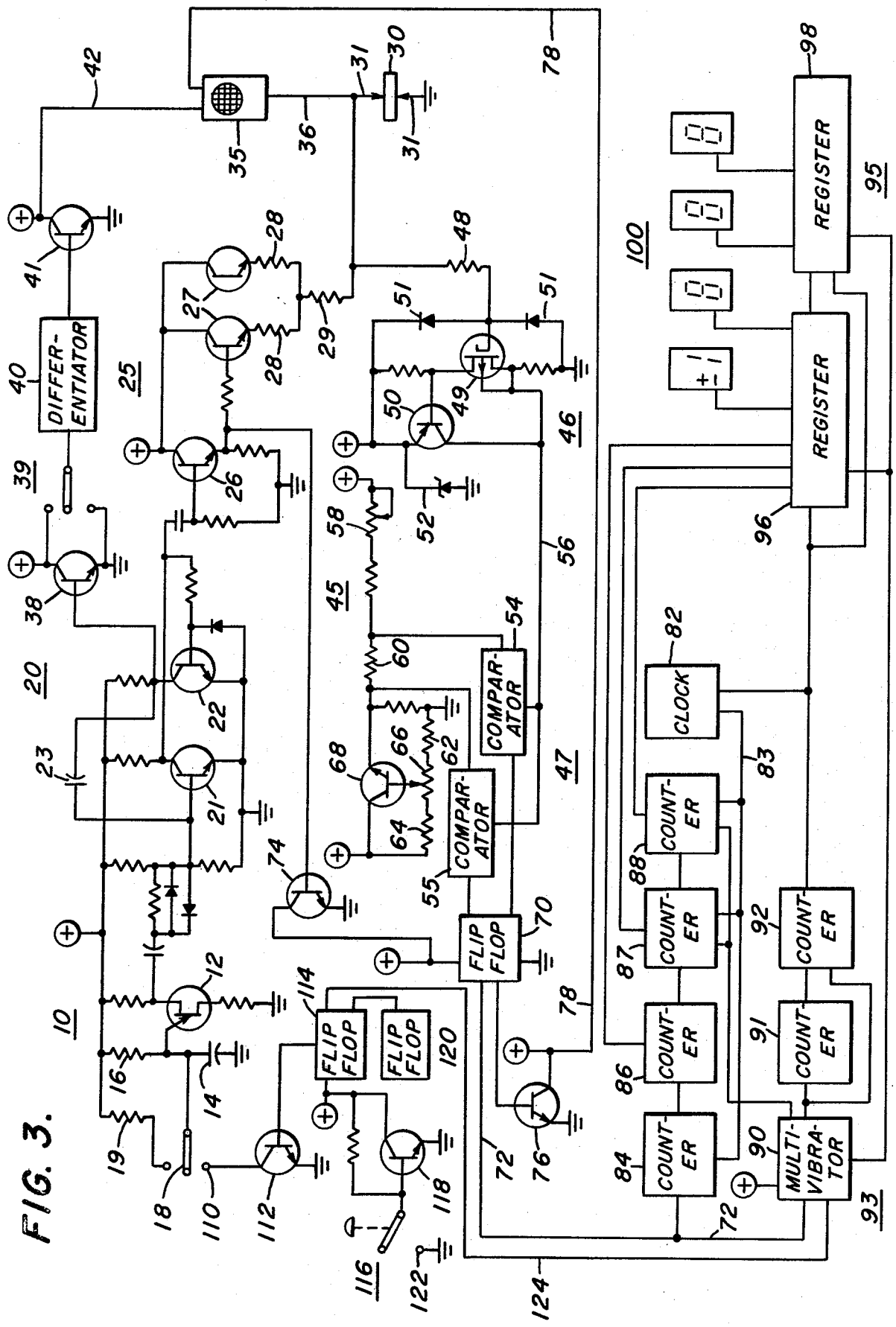
FIG. 3 is a schematic diagram of a typical embodiment of the invention.

A preferred embodiment of a system for measuring excess carrier lifetime in the manner described above is shown in the block diagram of FIG. 2 and the simplified schematic diagram of FIG. 3. The system includes a pulse generator for producing a series of substantially rectangular current pulses which are applied repetitively to a sample or device to be tested. The pulse generator includes an oscillator 10 which may comprise a transistor 12 and capacitor 14 connected to a suitable voltage source to function as a relaxation oscillator. The oscillator 10 produces a series of sharp pulses at a rate or frequency determined by the charging rate of the capacitor 14. This is determined by the value of the resistor 16 through which the capacitor charges, and the charging rate may be made adjustable by means of a manual rate switch 18 which is shown as having three positions. In the position shown, the charging rate and oscillation frequency are determined by the resistor 16. If the switch 18 is moved to the upper position, a resistor 19 is connected in parallel with the resistor 16 and the charging rate and frequency are correspondingly increased. Two different frequencies may thus be obtained by means of the switch 18, such as 400 Hz and 2000 Hz, for example. A third position for manual operation is also provided which will be discussed hereinafter.

The negative pulses from the oscillator 10 control the operation of a pulse former 20 which essentially comprises a monostable multivibrator including transistors 21 and 22. The oscillator 10 is coupled to the multivibrator and controls it to produce output pulses at the frequency determined by the oscillator. The pulse width of the output pulses of the pulse former 20 is determined by a capacitor 23 and may be of the order of 100 microseconds, for example. The output pulses are substantially rectangular current pulses with a minimum fall time so that the current drops to zero essentially instantaneously at termination of a pulse. It will be understood, of course, that any suitable or desired type of oscillator and pulse former might be utilized to provide a train of substantially rectangular current pulses for application to the sample to be tested.

The positive output pulses derived from the transistor 21 of the pulse former 20 are capacitor coupled to an output driver consisting of a Darlington amplifier 25. The amplifier 25 may include a transistor 26 and parallel-connected output transistors 27. Resistors 28 are connected in series with the transistors 27 to insure equal current sharing, and the total output current amplitude is determined by a resistor 29. The current pulses thus provided are applied to a sample 30 to be tested which may be any type of semiconductor device, such as a diode, transistor or thyristor, and which is placed between electrodes 31 which are preferably of a type which facilitates insertion and removal of the sample so that successive samples may be quickly inserted and removed. One terminal 31 is connected to the driver 25 and the other terminal is connected to ground so that the current pulses from the driver 25 are repetitively applied to the sample 30. The sample 30 must, of course, be connected with the correct polarity and, if desired, a reversing switch (not shown) may be provided to enable rapid change of the polarity.

While the carrier lifetime of the sample 30 is determined in the manner described below and displayed visually in a digital display, it is frequently desirable to observe the shape of the current pulse and of the voltage decay curve, and for this purpose an oscilloscope 35 is provided and connected to the sample 30 by a conductor 36 to monitor the voltage across the sample. The oscilloscope digital is triggered on each current pulse by means of a transistor 38 which responds to the negative pulses produced by the multivibrator 20. For this purpose, the base of the transistor 38 is connected to the collector of transistor 22, and the collector and emitter of the transistor 38 are connected to separate contacts of a two-position selector switch 39. The transistor 38 functions as a phase splitter and the switch 39 permits the selection of either of the two pulse polarities. The selected pulse passes through a differentiator 40, of any suitable type, and drives a transistor 41 which controls the oscilloscope 35 through a conductor 42 to trigger it into operation on each current pulse. The selection of one or the other pulse polarity by means of the switch 39 makes it possible to trigger the oscilloscope 35 at either the beginning or the end of a current pulse from the multivibrator 20. In this way, it is possible to display either the complete current pulse or only the voltage decay curve on the oscilloscope screen. Both portions of the curve contain information which is useful for development purposes in the design of semiconductors, or for setup purposes in a production situation, and it is highly desirable to be able to examine either or both portions of the curve on the oscilloscope.

As previously discussed, the excess carrier lifetime is determined by measuring the slope of the voltage decay curve of the sample 30 following termination of each current pulse. For this purpose, the sample voltage is applied to a window discriminator 45 which includes a buffer amplifier 46 and a voltage comparator 47. The buffer amplifier is a very high input impedance, wideband, unity gain amplifier, and because of its high input impedance, it is effectively an open circuit across the sample 30 so that the voltage decay characteristic is not substantially affected by the presence of the amplifier. The amplifier 46 includes a resistor 48 coupled to an FET transistor 49 and a transistor 50, gate protection being provided by diodes 51 and the output voltage to the comparator being limited by a diode 52.

The output of the buffer amplifier 46 is applied to the comparator 47 which consists of two voltage comparators 54 and 55, of any suitable type, which may conveniently be provided in the form of integrated circuits for compactness of assembly. The output of the amplifier 46 is applied to the comparators 54 and 55 through a conductor 56. A voltage is supplied to the comparators 54 and 55 through a potentiometer 58, and is applied directly to comparator 54 and through a resistor 60 to the comparator 55. Two different voltages, therefore, are supplied to the comparators 54 and 55, corresponding to the upper and lower voltage levels $V_1$ and $V_2$ of FIG. 1, which are determined by the resistor 60 and the setting of the potentiometer 58. A reference voltage is derived from resistors 62 and 64 and a potentiometer 66, which control a transistor 68 which serves as a low impedance source for the comparators. The adjustment of the potentiometer 66, therefore, determines the voltage level at which the measurement is made, which can thus be adjusted so that the slope of the voltage decay curve is measured in a region such as that indicated in FIG. 1 where the curve is essentially a straight line and the slope can be very accurately measured.

The voltage comparators 54 and 55 control a flip-flop 70 of any suitable type which may also be an integrated circuit. The comparator 54 responds to the output voltage of the buffer amplifier 46, which is the voltage across the sample 30, and when this voltage falls to the upper preset voltage level $V_1$ of FIG. 1, the comparator 54 sets, or turns ON, the flip-flop 70 so that an output appears on the output conductor 72. The voltage decreases as shown in FIG. 1, and when it has fallen to the lower preset voltage level $V_2$, the comparator 55 operates to reset, or turn OFF, the flip-flop 70. An output pulse, or gate pulse, thus appears on the output conductor 72 having a width corresponding to the time interval between the voltage levels $V_1$ and $V_2$. This output pulse represents the time interval between two voltage levels and is, therefore, inversely proportional to the slope of the voltage decay curve and is a measure of the excess carrier lifetime, as previously discussed.

The flip-flop 70 is enabled by a transistor 74, the base of which is connected to the input transistor 26 of the output driver 25. Thus, the transistor 74 is turned ON during the occurrence of an output pulse from the pulse generating circuit and disables the flip-flop 70. Upon termination of a pulse, the transistor 74 is turned OFF and the voltage is applied to flip-flop 70. In this way, the flip-flop can have an output only after the termination of the current pulse, so that the output pulse from the flip-flop 70 represents the slope of the voltage decay curve under open-circuit conditions after termination of the current pulse.

A transistor 76 is also connected to the flip-flop 70 in such a manner that it is turned OFF when the flip-flop 70 is ON. The collector of the transistor 76 is connected by a conductor 78 to the oscilloscope 35 and when the transistor 76 is OFF, a voltage is applied through conductor 78 to the oscilloscope. This is a relatively high voltage and is utilized to intensify the oscilloscope trace during the time when the output pulse from the flip-flop 70 is ocurring. The oscilloscope trace thus shows an intensified region, or region of increased brightness, corresponding to the portion of the voltage curve between the voltage levels $V_1$ and $V_2$, and thus indicates on the oscilloscope screen the exact portion of the curve on which the measurement is being made, the position or voltage level of this portion being adjustable by the potentiometer 66 as previously described.

The width of the output pulse appearing on the conductor 72 contains the desired information representing the slope of the voltage decay curve at the reference voltage level. This information is transmitted to counter and timing circuits for processing to the desired digital output from showing the carrier lifetime. These circuits may be of any suitable type and are preferably commercially available integrated circuit devices. A clock or timing circuit 82 is provided which produces a timing or clock signal on a bus 83 for controlling the various counters and timing elements. The clock circuit 82 may, for example, include a high frequency crystal oscillator producing output pulses at a frequency of 12.5 megahertz, and if desired means may be provided for selecting either of two frequencies. That is, the 12.5 megahertz output, which corresponds to a pulse interval of 80 nanoseconds, may be used directly, or a decade counter may also be provided to change the pulse interval to 800 nanoseconds, when desired, by passing only every tenth pulse. Other clock frequencies could, of course, be used.

The output pulses, or gate pulses, on the conductor 72 are applied to a counter 84 which, in effect, counts the number of clock pulses on the bus 83 corresponding to the width of the gate pulse on the conductor 72 to provide a digital signal representing the time interval between the voltages $V_1$ and $V_2$ and, therefore, the slope of the curve. Preferably, the counter 84 divides the clock pulses by 16, so that each measurement is a composite or average of 16 individual measurements. The clock pulses from the counter 84 are accumulated by counters 86, 87 and 88, which are digital counters of any suitable type, and which generate the desired digital output data preferably in the form of binary coded decimal (BCD) data.

For timing and display control purposes, the gate pulses on the conductor 72 are also applied to a dual one-shot multivibrator 90 which generates a timing pulse at the end of each gate pulse. The multivibrator 90, together with counters 91 and 92, form the timer 93. The counter 91 is a hexadecimal counter which counts the timing pulses from the multivibrator 90. After 16 timing pulses have been counted, counter 91 generates an enable signal for the data latch 95 and counter 92. Hexadecimal counter 92 also sees the timing pulses from multivibrator 90, but only counts when enabled by counter 91. Thus, after 16 × 16 or 256 timing pulses, counter 92 generates an enable signal for the data latch 95.

When the data latch, comprising registers 96 and 98, is simultaneously enabled by counters 91 and 92, the BCD data from the counters 86, 87 and 88 is transferred to the registers 96 and 98. The trailing edge of the enable signal from counter 91 triggers the second half of the multivibrator 90, generating a pulse to reset the counters 86, 87 and 88. Therefore, the final count in the data latch 95 represents an average or composite and is regularly updated as long as the pulse generator is in operation. The registers 96 and 98 may be conventional registers which receive the BCD data from the counters, and may include decoders for converting the data to the necessary signals for controlling a visual digital display, or separate decoders may be provided if desired. The display 100 may be a conventional 3½digit display using light-emitting diodes, liquid crystals or other types of display elements, as diagrammatically indicated in the drawing, to display the excess carrier lifetime digitally in microseconds.

As previously discussed, the lifetime is an inverse function of the slope of the voltage decay curve and since the slope is measured in terms of time, it can be directly converted in the counter circuitry to yield the lifetime in microseconds. The data processing circuitry, that is, the timing and counter elements, and the registers and display elements, may be of any suitable or desired type and have been shown only schematically on the drawing since the detailed circuitry is not a part of the present invention. Thus, the various elements have been shown as blocks which represent integrated circuit devices for performing the functions described. These are known, commercially available devices and their interconnections have been shown diagrammatically to indicate the functional relations. Any suitable circuitry, of course, may be used for taking the output or gate pulses from the flip-flop 70 and processing the information therein contained to provide a digital display of the carrier recombination lifetime in the sample 30. The type of circuitry discussed above, however, is preferred because of its high degree of accuracy and reliability since it averages 16 measurements and then takes these in groups of 16 so that the final display is a composite of 256 individual measurements.

The system shown also includes another desirable feature which permits manual operation to display a single group of 16 measurements, thus showing an instantaneous condition rather than a continuously updated composite or average. This is accomplished by means of a third contact 110 on the rate switch 18 previously described. The contact 110 is connected to the collector of a transistor 112 which, in turn, is controlled by a flip-flop 114. When the flip-flop 114 is in the ON or conducting state, the transistor 112 is ON and if the switch 18 is on the manual contact 110, the capacitor 14 is shorted out and the oscillator 10 is thus made inoperative. Operation is then controlled by a pushbutton-type manual switch 116 connected to the base of a transistor 118 as shown. In the normal inoperative position shown in the drawing, the transistor 118 is ON and controls a second flip-flop 120 so that it is in the OFF condition, the flip-flop 114 being ON as described above. When the manual switch 116 is actuated to the contact 122, the transistor 118 is turned OFF which results in turning the flip-flop 120 ON and turning the flip-flop 114 OFF.

The transistor 112 is thus turned OFF and the oscillator 10 is then free to function normally which results in the production of output current pulses applied to the sample 30 in the manner previously described at the normal frequency of the oscillator 10.

The resulting output or gate pulses on the conductor 72 are counted by the counter 84 and after 16 pulses have been counted, the BCD data in the counters 86, 87 and 88 passes to the registers 96 and 98 for digital display, all as previously described. Simultaneously, the pulse from the multivibrator 90 which resets the counters is also applied through conductor 124 to turn ON the flip-flop 114. This turns ON the transistor 112 and thus again inactivates the oscillator 10. In this way, a single reading is obtained on the display 100 representing the average of 16 individual current pulses. This provides a single instantaneous reading of the lifetime, and the voltage decay curve may also be simultaneously observed on the oscilloscope. Such a single reading is sometimes desirable, rather than the continuously updated average reading obtained in normal operation, and can be particularly useful for design, or research and development purposes, since the current pulses applied to the sample 30 may themselves cause changes in its characteristics and an isolated instantaneous reading is desirable. The circuit described makes this possible by placing the rate switch 18 on the manual contact 110 and then momentarily depressing the manual switch 16 when a reading is desired.

It will now be apparent that a system has been provided for measuring the excess carrier lifetime of a semiconductor device in a very simple and accurate manner. A direct digital display of the lifetime in microseconds is provided so that no measurement or interpretation of an oscilloscope display is required, and operator error is eliminated while increased resolution and accuracy are obtained. An oscilloscope display is also provided, for examination of the current pulses and voltage decay curve, and means are provided for intensifying the oscilloscope trace in the region where the slope is being measured. This is a great advantage in setting up for production as well as for many other purposes. The system disclosed is of great usefulness for quality control purposes as it permits rapid and accurate testing of semiconductor devices in production and is, therefore, a very useful instrument for maintaining the desired characteristics of such devices.

I claim as my invention:

1. A system for measuring excess carrier lifetime in semiconductor devices, said system comprising a pulse generator for generating a series of substantially rectangular current pulses and applying said current pulses repetitively to a device to be measured, means for observing the open circuit voltage across said device upon termination of each current pulse including comparator means for establishing upper and lower voltage levels separated by a preset voltage difference, means controlled by said comparator means for initiating an output pulse when the voltage across said device falls to said upper voltage level and for terminating said output pulse when the voltage decays to said lower voltage level, means for permitting initiation of an output pulse only after termination of a current pulse, and means controlled by the width of said output pulses for determining and visually displaying the numerical value of said lifetime.

2. A system as defined in claim 1 including means responsive to the occurrence of an output pulse for generating digital signals corresponding to the width of the pulse, digital display means, and means for processing said signals and applying them to the display means for visually displaying the numerical value of said lifetime.

3. A system as defined in claim 2 in which said processing means includes clock means for generating a train of pulses at high frequency, means for counting said pulses between initiation and termination of said output pulses to obtain said digital signals, means for storing and averaging said digital signals, and means for periodically applying the averaged signals to said display means.

4. The system defined in claim 2 including manual means for controlling said pulse generator to initiate operation thereof, and counter means for turning OFF the pulse generator and actuating the display means after a predetermined number of output pulses have occurred.

5. A system as defined in claim 1 including oscilloscope means for visually displaying the voltage across said device, and means controlled by the pulse generator for turning ON said oscilloscope means upon the occurrence of each current pulse.

6. A system as defined in claim 5 including means for turning the oscilloscope means ON alternatively at the beginning or at the end of each current pulse.

7. A system as defined in claim 5 including means controlled by said comparator means for increasing the visual intensity of the oscilloscope display for the duration of each output pulse.

8. A system for measuring excess carrier lifetime in semiconductor devices, said system comprising a pulse generator for generating a series of substantially rectangular current pulses, means for applying said current pulses repetitively to a device to be measured, a discriminator circuit connected to respond to the voltage across said device, said circuit including first and second comparators and an output switching device controlled by said comparators, said first comparator being operative to cause said switching device to initiate an output signal pulse when said voltage across the device to be measured falls below a first predetermined voltage level, said second comparator being operative to cause said switching device to terminate the output signal pulse when said voltage falls below a second lower predetermined voltage level, means controlled by said pulse generator for enabling said switching device to produce an output signal only upon termination of a current pulse, common adjustment means for adjusting said predetermined voltage levels, means for setting the voltage difference between said voltage levels, processing means responsive to the length of said output signal pulses for determining said carrier lifetime, and means for visually displaying the numerical value of said lifetime.

9. A system as defined in claim 8 in which said processing means includes means for storing and averaging digital signals corresponding to successive output signal pulses, and means for repetitively applying said averaged signals to said visual display means.

10. A system as defined in claim 9 and including manual means for controlling said pulse generator, said processing means including a counter connectable by said manual means to cause said pulse generator to be turned OFF and said display means actuated after a predetermined number of output signal pulses.

11. A system as defined in claim 8 including oscilloscope means, and means controlled by said pulse generator for triggering the oscilloscope upon the occurrence of each current pulse to visually display the voltage across the device to be measured.

12. A system as defined in claim 11 including means for selectively triggering the oscilloscope at either the beginning or the end of each current pulse.

* * * * *